(12) United States Patent
Schnabel et al.

(10) Patent No.: US 6,544,850 B1
(45) Date of Patent: Apr. 8, 2003

(54) DYNAMIC RANDOM ACCESS MEMORY

(75) Inventors: Ranier Florian Schnabel, Höhenkirchen (DE); Ulrike Gruening, Munich (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/552,635

(22) Filed: Apr. 19, 2000

(51) Int. Cl.[7] .............................................. H01L 21/336
(52) U.S. Cl. .................... 438/286; 257/506; 365/65; 365/69; 365/70; 365/79
(58) Field of Search ...................... 438/286; 257/506; 365/69, 79, 70, 65

(56) References Cited

U.S. PATENT DOCUMENTS

| | | | | |
|---|---|---|---|---|
| 4,824,399 A | * | 4/1989 | Bogar et al. ............... | 439/578 |
| 4,860,088 A | * | 8/1989 | Smith et al. ............... | 357/69 |
| 5,036,379 A | * | 7/1991 | Smith et al. ............... | 357/69 |
| 5,282,754 A | * | 2/1994 | Kish et al. ............... | 439/108 |

* cited by examiner

Primary Examiner—Richard Elms
Assistant Examiner—Pho Luu

(57) ABSTRACT

A dynamic random access memory (DRAM) formed in a silicon chip that includes a support area in which support circuitry of the memory includes a single electrical contact through two dielectric layers to a conductive layer of a gate stack of a field effect support transistor that has a capping layer through which the electrical contact passes to the gate. The DRAM also includes a memory area containing an array of memory cells each include a field effect transistor. Drain regions of the transistors of the memory cells and drain and source regions of field effect transistors of the support transistors have first electrical contacts thereto through the first dielectric layer and have second electrical contacts which pass through the second dielectric layer and electrical contact to the first electrical contacts. Forming of the second electrical contacts concurrently with the single electrical contact to the gate of the support transistor saves a processing step over prior art processes.

24 Claims, 9 Drawing Sheets

DYNAMIC RANDOM ACCESS MEMORY

FIELD OF INVENTION

This invention relates to the manufacture of integrated circuit devices, and more particularly, to devices, such as dynamic random access memories (DRAMs) that include in a silicon chip both a memory array area where is located an array of memory cells in which information is stored and a support area where is located support circuitry that controls reading and writing of the individual memory cells by way of bit and word lines.

BACKGROUND OF THE INVENTION

In the manufacture of DRAMs there is a trend towards increasing the number of memory cells in a DRAM and this typically involves decreasing the size of the memory cells in the DRAM and spacing them closer. Moreover, to keep costs low, it is desirable to keep the number of processing steps as small as possible.

A DRAM includes a semiconductive chip, generally of silicon, in which are formed the active circuit elements appropriately interconnected by a pattern of conductive paths (electrical conductors) disposed between dielectric layers. The DRAM typically has one or more memory array areas which contain memory cells and support areas which contain circuitry used to control reading, writing, refreshing, of information in the memory cells as well as other functions such as sensing information read out of the memory cells. For purposes of this application, it will be convenient to view the conductive paths as comprising conductive contact layers at the outer surfaces of appropriate regions of the circuit elements, such as transistor switches and storage capacitors, conductive interconnection lines that are generally horizontal and parallel to the top surface of the wafer, such as the bit and word lines, and conductive vias (electrical conductors, studs) that are generally vertical and interconnect the contact layers to the interconnection lines. In particular, in the method of manufacturing a form of DRAM that the present invention aims to improve, there are three distinct connections of these, the first type is typically described as an electrical contact to bit line (CB) which electrically connects bit lines to drain/source regions of the transistors in the memory array areas. The second type is typically described as a contact to diffusion (CD) that electrically contacts various diffused regions in a semiconductor substrate such as source and drain regions of transistors in the support areas. The third type is typically described as an electrical contact to the gates (CG) and it involves the connection of the word lines to the gates of the transistors both in the array and support areas. Because of the manner in which the interconnections are customarily made, to be described below, the manufacturing process, which this invention seeks to improve is believed to be unnecessarily complex in that it requires more masking steps than desired.

It is desirable to reduce the number of processing steps used to fabricate DRAMs.

SUMMARY OF THE INVENTION

The present invention is directed to an integrated circuit, e.g., a DRAM, and a process for fabricating an integrated circuit, e.g., a DRAM, which requires one less masking step than conventional (prior art) processes. The improved processing of the present invention makes it feasible to form electrical contacts to a conductive layer of a gate stack of transistors of a support area of an integrated circuit (silicon chip) in one processing sequence involving the use of only one mask and a single etching and deposition step. This is made possible by use of a masking step that permits use of an etchant that etches the silicon dioxide covering a gate stack and a silicon nitride capping layer that forms a top layer of the gate stack.

Viewed from a first apparatus aspect, the present invention is directed to an integrated circuit formed in and/or on a semiconductor substrate that is covered by first and second dielectric layers and that comprises a plurality of devices formed in and/or on the semiconductor substrate with at least some of the devices having contact regions which are covered by a third dielectric layer which has a different etch characteristic than the first and second dielectric layers. The integrated circuit comprises first, second and third continuous electrical conductors. The first continuous electrical conductor extends through the first, second, and third dielectric layers and makes electrical contact to a contact region of one device. The second continuous electrical conductor extends through the first dielectric layer and makes electrical contact to a contact region of a device which does not have a third dielectric layer covering the contacted contact region. The third continuous electrical conductor extends through the second dielectric layer and makes electrical contact to the second continuous electrical conductor.

Viewed from a second apparatus aspect, the present invention is directed to a dynamic random access memory that is formed in a silicon chip that is covered by first and second dielectric layers and that comprises a memory array area that includes an array of memory cells each comprising a field effect transistor which each include source and drain regions and a gate stack, formed over a channel region and spaced therefrom by a gate dielectric, that includes in turn a doped-polysilicon conductive gate, a metal contact layer, a dielectric capping layer, and a dielectric spacer along sidewalls thereof that include silicon nitride, and a support area that includes field effect transistors which each include source and drain regions and a gate stack, formed over a channel region portion of the silicon chip and spaced therefrom by a gate dielectric, that includes in turn a doped-polysilicon conductive gate, a metal contact layer, a dielectric capping layer, and a dielectric spacer along sidewalls thereof that include silicon nitride. The the dynamic random access memory comprises a plurality of first second and third continuous electrical conductors. The plurality of first continuous electrical conductors extends through the first and second dielectric layers with at least one of said first continuous conductors extending through the capping dielectric layer of the gate stack of one support transistor to the metal contact layer of the gate stack. The plurality of second continuous electrical conductors extends through the first dielectric layer with at least one of said continuous electrical conductors contacting the drain region of a transistor of a memory cell of the memory area and at least two other of the second continuous electrical conductors with one contacting the drain region and one contacting the source region of one support transistor of the support area. The plurality of third continuous electrical conductors extends through the second dielectric layer with one of the third continuous electrical conductors electrically contacting one of the plurality of second continuous electrical conductors which contacts the drain region of a transistor of a memory cell, and with a second of the third continuous conductors electrically contacting the one of the second continuous electrical conductors which electrically contacts the drain region of the transistor of a support transistor of the support area, and with a third of the second continuous electrical conductors electrically contacting the one of the second continuous electrical conductors which electrically contacts the source region of the support transistor of the support area.

Viewed from a first process aspect, the present invention is directed to a method for forming an integrated circuit in a semiconductor substrate. The method comprises the steps of: forming in and/or on the semiconductor substrate devices which have contact regions with at least one of the devices having a contact region which is covered by a first dielectric layer; covering the surface of the substrate with a second dielectric layer that is planarized and that covers the devices, the second dielectric layer having a different etch characteristic than the first dielectric layer; patterning the second planarized dielectric layer to provide openings therethrough to contact regions of devices that are not covered by the first dielectric layer; filling the openings in the second planarized layer of dielectric with conductive material to form electrical contacts to the contact regions of devices that are not covered by the first dielectric layer; covering the second dielectric layer with a third planarized dielectric layer, the third dielectric layer having a different etch characteristic than the first dielectric layer; patterning the third planarized dielectric layer to form openings therethrough and through the second dielectric layer and the first dielectric layer to contact regions of the devices which are covered by the first dielectric layer; and filling openings in the first, second, and third dielectric layers with conductive material to provide electrical conductors to the contact regions which have the first dielectric layer covering same and to provide electrical conductors to the electrical conductors previously formed through the second dielectric layer to contact contact regions not covered by the first dielectric layer.

Viewed from a second process aspect, the present invention is directed to a method for forming in a silicon chip a dynamic random access memory that includes an array of memory cells in an array area of the chip and support circuitry in a support area of the chip. The method comprises the steps of: forming in the array area of the chip an array of memory cells including array transistors and in the support area support circuitry including support field effect transistors, each of the transistors including source and drain regions and a gate stack overlying a channel region at the surface of the chip separating a source region and a drain region thereof; covering the surface of the chip with a first planarized layer of a dielectric that encloses the gate stacks of the array and the support transistors; patterning the first planarized layer of dielectric to provide openings therethrough to the drain regions of the transistors in the array area and to the source and drain regions of the transistors of the support area; filling the openings in the first planarized layer of dielectric with conductive material to form electrical contacts to the drain regions of the transistors in the array area and to the source and drain regions of the transistors in the support areas; covering the previously covered silicon chip with a second planarized layer of dielectric; patterning the second planarized layer of dielectric to form openings therethrough and through the first dielectric layer to the gates of the gate stacks of the transistors in the support area and through the second dielectric layer to the electrical contacts to the drain regions of the transistors in the array area and through the first dielectric layer to the electrical contacts of the source and drain regions of the transistors in support areas; and filling openings in the first and second dielectric layers with a conductor to provide electrical conductors to the gates of the support transistors, and filling the openings in the second dielectric layer to provide electrical conductors to the electrical conductors previously formed through the first dielectric layer to the drain regions of the array transistors and to the sources and drain regions of the support transistors.

Viewed from a third process aspect, the present invention is directed to a method for use in the fabricating a semiconductor chip housing a dynamic random access memory (DRAM) having memory cells each comprising a field effect transistor having source and drain regions and a gate, and support circuitry comprising field effect transistors each having a source and drain regions and a gate, for forming electrical connections through formed first and second dielectric layers covering the chip to drain regions of field effect transistors of memory cells and to drain and source regions and gates of at least one of the field effect transistors of the support circuitry of the DRAM. The method comprises the steps of: before the second dielectric layer is formed over the chip, defining and etching first openings through the first dielectric layer to the drain regions of the transistors of the memory cells and to the source and drain regions of at least one of the transistors of the support circuitry; filling the first openings in the first dielectric layer with conductive material and then forming the second dielectric layer over the chip, said conductive material forming electric contacts to the drain regions of the transistors of the memory cells and to the drain and source regions of at least one of the transistors of the support circuitry; defining and etching first openings through the second dielectric layer which terminate at the conductive material previously used to fill the first openings in the first dielectric layer, and defining and etching additional first openings through the second dielectric layer which also extend through the first dielectric layer to form second opening through the first dielectric layer which extend to the gates of the support transistors; filling all the first openings in the second dielectric layer and the second openings in the first dielectric layer with conductive material such electrical contacts through the first and second dielectric layers are made to the drains of the transistors of the memory cells and to the source and drain regions and gate of transistors of the support circuitry.

The invention will be better understood from the following more detailed description in conjunction with the accompanying drawing.

DETAILED DESCRIPTION

Figure 1:
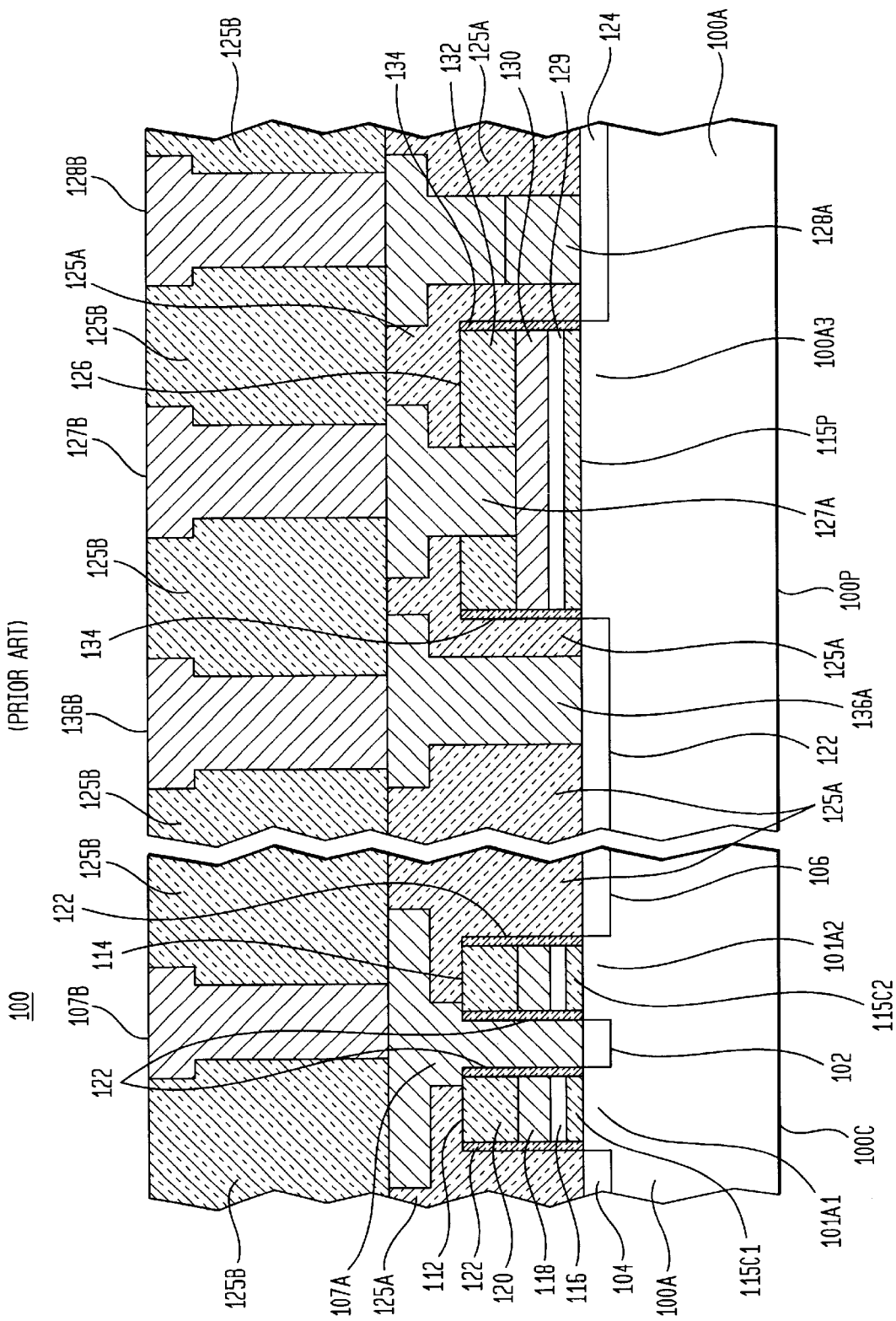
FIG. 1 shows a cross section of a portion of a first silicon chip that includes a memory array area and a portion of a support area of a prior art DRAM of the kind the present invention aims to improve.

FIG. 1 shows schematically a portion of a prior art DRAM comprising a silicon chip 100 that is shown separated into two areas: the first area 100C in which are located the field effect transistors of an array of memory cells, typically in the center of the chip 100; and a second area 100P in which are located the field effect transistors of the support circuitry, typically located along the periphery of the chip 100. These areas are formed on a semiconductor body (substrate) 100A of a first conductivity type. The field effect transistors shown are insulated gated field effect transistors (IGFETS), which are also denoted as n-channel or p-channel Metal-Oxide-Semiconductor (MOS) transistors or simply NMOS or PMOS transistors.

In the area 100C are shown two field effect transistors that share a common drain region 102, of a conductivity type opposite the first conductivity type, and have separate source regions 104 and 106, of a conductivity type opposite the first conductivity type. These transistors each form a portion of a separate memory cell. A separate capacitor (not shown) is generally coupled to each of source regions 104 and 106 as part of the circuitry of a memory cell. The capacitor can be a trench type capacitor formed in a trench in substrate 100A, can be a stacked capacitor formed above a top surface of substrate 100A, or can be any other type of integrated circuit capacitor. Typically these transistors are n-channel metal-oxide-semiconductor (MOS) transistors with the sources regions 104 and 106 and the drain region 102 being of n-type conductivity and the semiconductor body 100A being of p-type conductivity. Drain region 102 is connected to a bit line (not shown) by way of an electrical conductor comprising separately formed first portion 107A and second portion 107B. On opposite sides of the drain 102 in the body 100A are separate channel p-type portions 100A1 and 100A2 of body 100A, over which lie gate dielectric layers 115C1 and 115C2, respectively, typically of silicon oxide, over which lie separate gate stacks 112 and 114. Each gate stack 112,114 includes an underlying conductive contact layer 116, typically of doped polysilicon, an overlying layer 118 of metal, typically of tungsten or platinum, to reduce the resistance of the gate, and finally a dielectric capping layer 120, typically of silicon nitride. Additionally, dielectric space layers 122, which typically comprise an underlying layer of silicon oxide covered by an overlying layer of silicon nitride, cover sidewalls of each of gate stacks 112 and 114.

In the type of DRAM which uses trench capacitors, each of the sources 104, 106 of the array transistors is generally connected by a conductive strap (not shown) within the chip to a plate of a storage capacitor (not shown) so that no separate source electric conductor is shown in the drawing for the array transistors.

Overlying the silicon chip 100 is a capping layer comprising separately formed lower portion 125A and an upper portion 125B of a suitable dielectric, such as a borophosphosilicate glass (BPSG) in which are formed the various conductive paths used for the interconnection pattern.

In the support area 100P there is shown only one IGFET that is representative of both the p-type channel and n-type channel MOS support transistors. The connections to the diffused source and drain regions of the transistors of the support circuitry are identical for both the n-type and p-type transistors so that it suffices for present purposes to show only one type of transistor. This transistor includes a drain region 122 separated by a portion 100A3 (the channel of the transistor) of body 100A from a source region 124 and also a gate stack 126, overlying the channel (portion 100A3). The gate stack 126 here is shown wider than that of the gate stacks 112 and 114 of the array transistors since such support transistors are typically larger because of a need to handle larger currents. The gate stack 126 are typically similar in composition to the gate stacks 112 and 114, and in each case the electrical conductor to the metal gate conductor of the stack has been formed in two separate steps. As such, gate stack 126 typically includes an underlying conductive layer 129, typically of doped polysilicon, a layer 130 of metal, typically of tungsten or platinum, that serves to reduce the resistance of the gate, and finally a capping layer 132, typically of silicon nitride. Additionally, sidewalls of the gate stack 126 include a dielectric spacer 134, typically comprising an underlying layer of silicon oxide covered by an overlying layer of silicon nitride. An electrical conductor comprising portions 127A and 127B connects to contact layer 130. Portions 127A and 127B are formed by separate masking etching and depositing steps. Conductive polysilicon layer 129 is separated from portion 100A3 by a gate dielectric layer 115P. An electrical conductor comprising separately formed portions 136A and 136B is provided to the drain region 122 and a separate electrical conductor comprising vertical separately formed portions 128A and 128B is provided to the source region 124.

It is characteristic of the design of FIG. 1 that the etching step used to form the openings in the first dielectric layer 125A for the conductor 107A to the drain region 102 of the memory cell transistor uses an etchant that selectively etches silicon oxide but not silicon nitride. Etching of openings in the first dielectric layer 225 for the conductor 136A to the drain of the support transistor and for the conductor 128A for the source of the support transistor uses an etchant which etches silicon oxide but may or may not etch silicon nitride. Typically the openings for conductors 107A and 127A are formed during separate steps. The openings for conductors 136A and 128A are formed at the same time but typically separate from the openings for other conductors. This type of etchant is used because there needs to be avoided etching of silicon nitride since the side wall spacers 122 of the memory cell transistor would be otherwise etched away and cause a short-circuit between the gate and drain. This type of selective etchant will not etch an opening in the silicon nitride capping layer 132 of the gate stack 126 of the support transistor and thus a separate etchant and etching step is needed to form the gate conductor 127A.

It is to be noted that the drain and source regions reverse roles as current through the transistor reverses during a read operation and a write operation. In the support transistor the electrical conductors (136a, 136B, and 128A, 128B) to the source region 122 and the drain region 124, respectively, are formed a distance from the sidewall spacers 134 of the gate stack 126.

Figure 2:
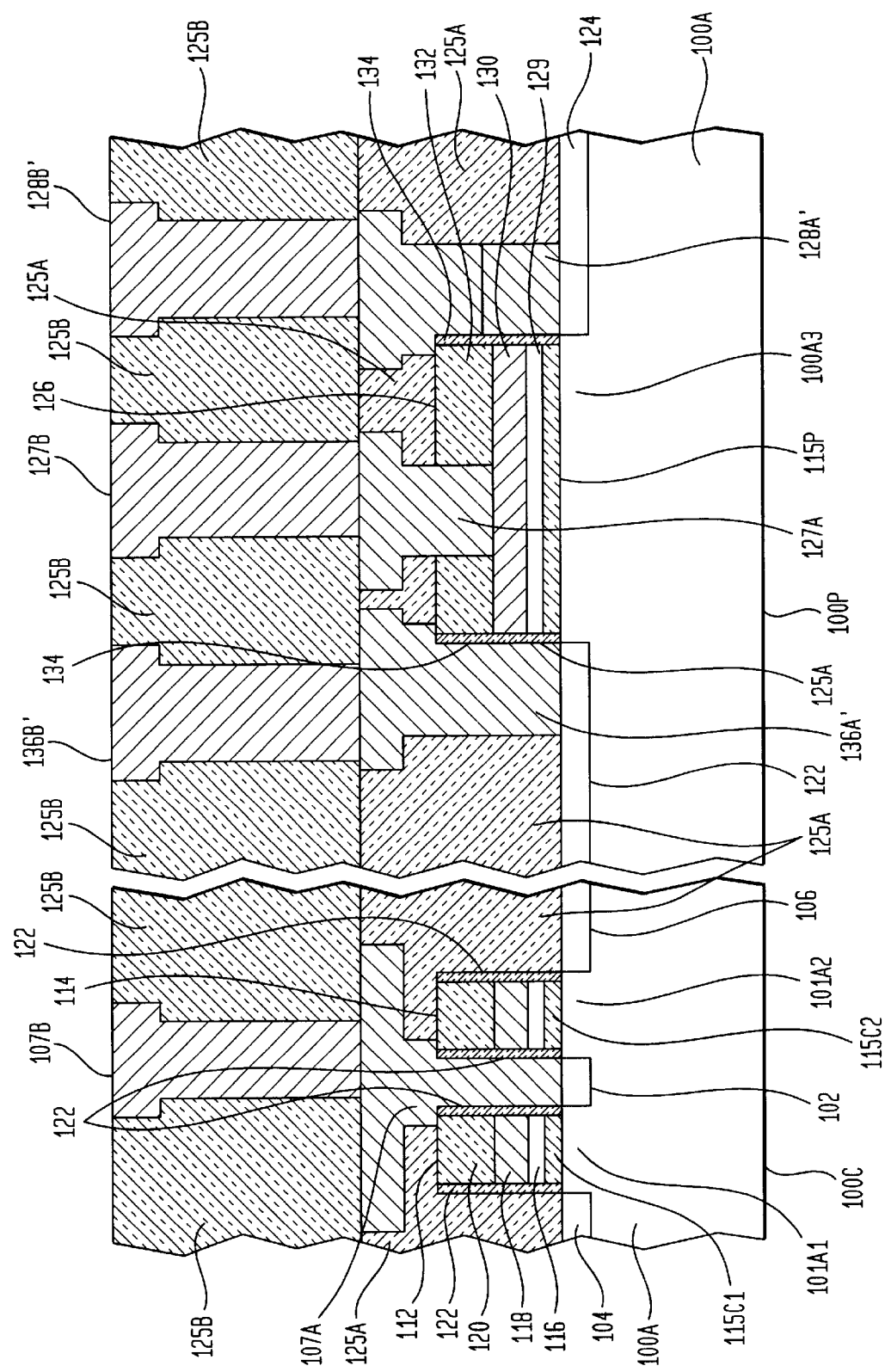
FIG. 2 shows cross section of a portion of a second silicon chip that includes a memory array area and a portion of a support area of a prior art DRAM of the kind the present invention aims to improve.

FIG. 2 shows a portion of another prior art DRAM 100' which is very similar to DRAM 100 of FIG. 1 with essentially identical portions having the same reference designation and with similar portions having the same reference designation with a",", added there after. The only substantive difference between DRAM 100' of FIG. 2 and DRAM 100 of FIG. 1 is that DRAM 100' of FIG. 2 has electrical conductors 136A' and 128A' formed up against side wall spacers 134 instead of being separated therefrom as are electrical conductors 136A and 128A of FIG. 1. DRAMs 100 and 100' both use two separate mask steps to form electrical conductors 127A and 127B to conductive contact layer 130 of gate stack 126. The openings for conductors 107A, 136A', and 128A' can be formed at the same time using an etchant which selectively etches silicon oxide but not silicon nitride.

Figure 3:
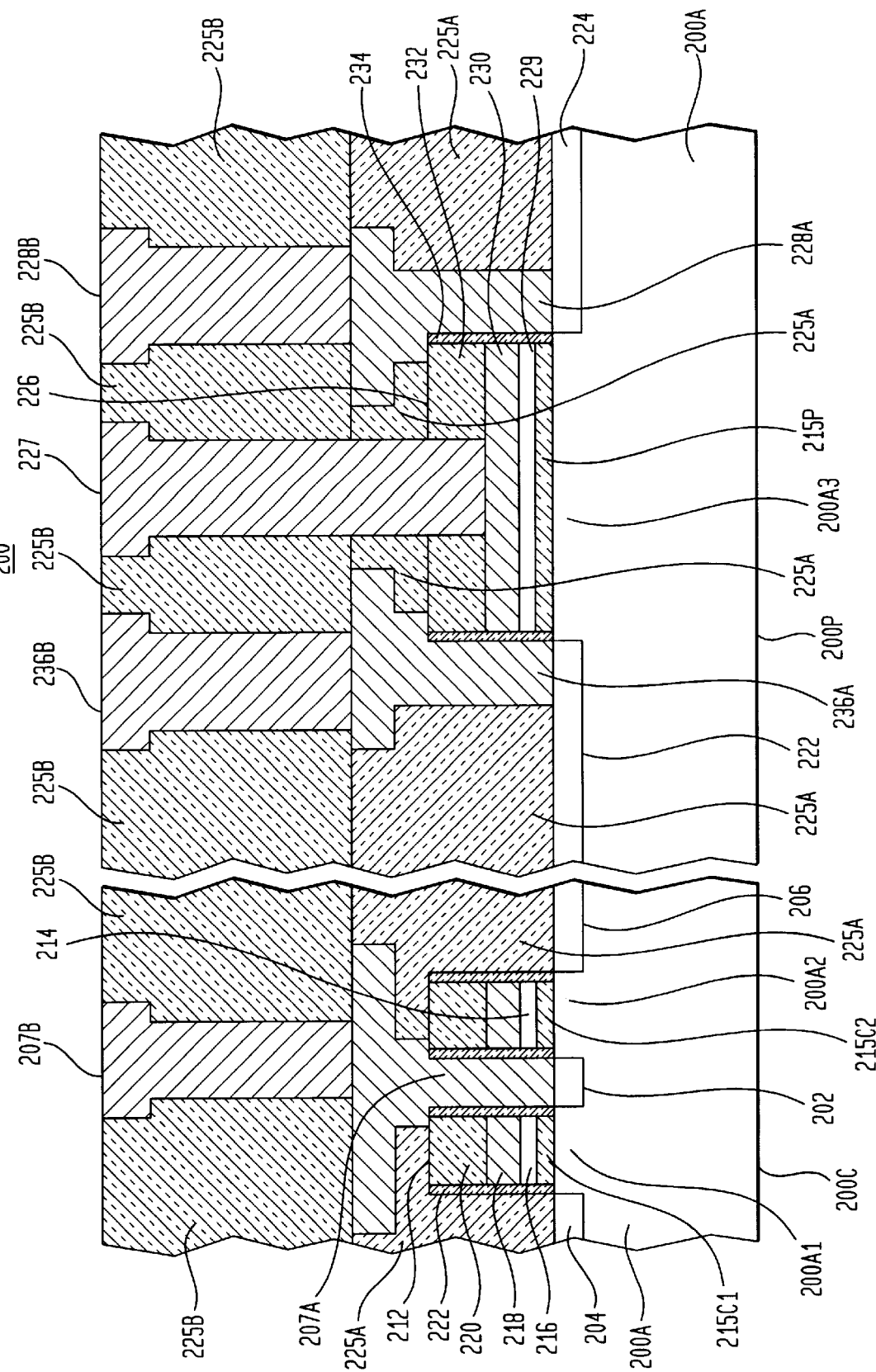
FIG. 3 is a cross section of a portion of a silicon chip that includes a portion of a memory array area and a portion of a support area of a DRAM made in accordance with the present invention.

FIG. 3 show a silicon chip 200 in which there has been formed a DRAM in accordance with an exemplary embodiment of the present invention. A DRAM is just one illustrative example of many different types of integrated circuits which can benefit from the structure and method of the present invention. The chip 200 is shown separated into two areas: the first area 200C in which are located field effect transistors of an array of memory cells, typically located in the center of the chip 200; and a second area 200P in which are located field effect transistors of support circuitry, typically located along the periphery of the chip 200, and formed on a semiconductor body (substrate) 200A of a first conductivity type.

The array area 200C is essentially identical to the array area 100C of FIG. 2 and so it will be unnecessary to describe such area. The parts of semiconductor chip 200 which are similar and/or identical to those of chip 100' of FIG. 2 have the same number with 100 added thereto and the "'" deleted. In the support area 200P, there is shown a single transistor that includes a gate stack 226 of the kind described earlier overlying a channel region 200A3 between drain region 222 and the source region 224. Each of these is provided with a separate electrical contact 227 that overlies the gate stack 226 and makes electrical contact to metal layer 130 of gate stack 226. The main difference between single electrical conductor 227 of FIG. 3 and serially connected electrical conductors 127A and 127B of FIG. 2 is that one fewer masking etching step and depositing step is needed to fabricate electrical conductor 227 than is needed to fabricate electrical conductors 127A and 127B of the prior art form. This savings in a process step can result in reduced fabrication costs. The electrical conductors 236A and 228A to the drain region 222 and source region 224, respectively, are shown positioned contiguous to sidewall spacers 234 of the gate stack 226 as are corresponding portions of chip 100' of FIG. 2

The prior art techniques of forming the gate contact and vias of the transistors in the support area of FIGS. 1 and 2 is to first form the lower portion 127A, 127A', and then form separately the second portion 127B, 127B'. This requires separate masks for the two separate metal depositions.

A presently preferred process for forming a novel device (e.g., chip 200 of FIG. 3) in accordance with the present invention is described herein below.

Figure 4:
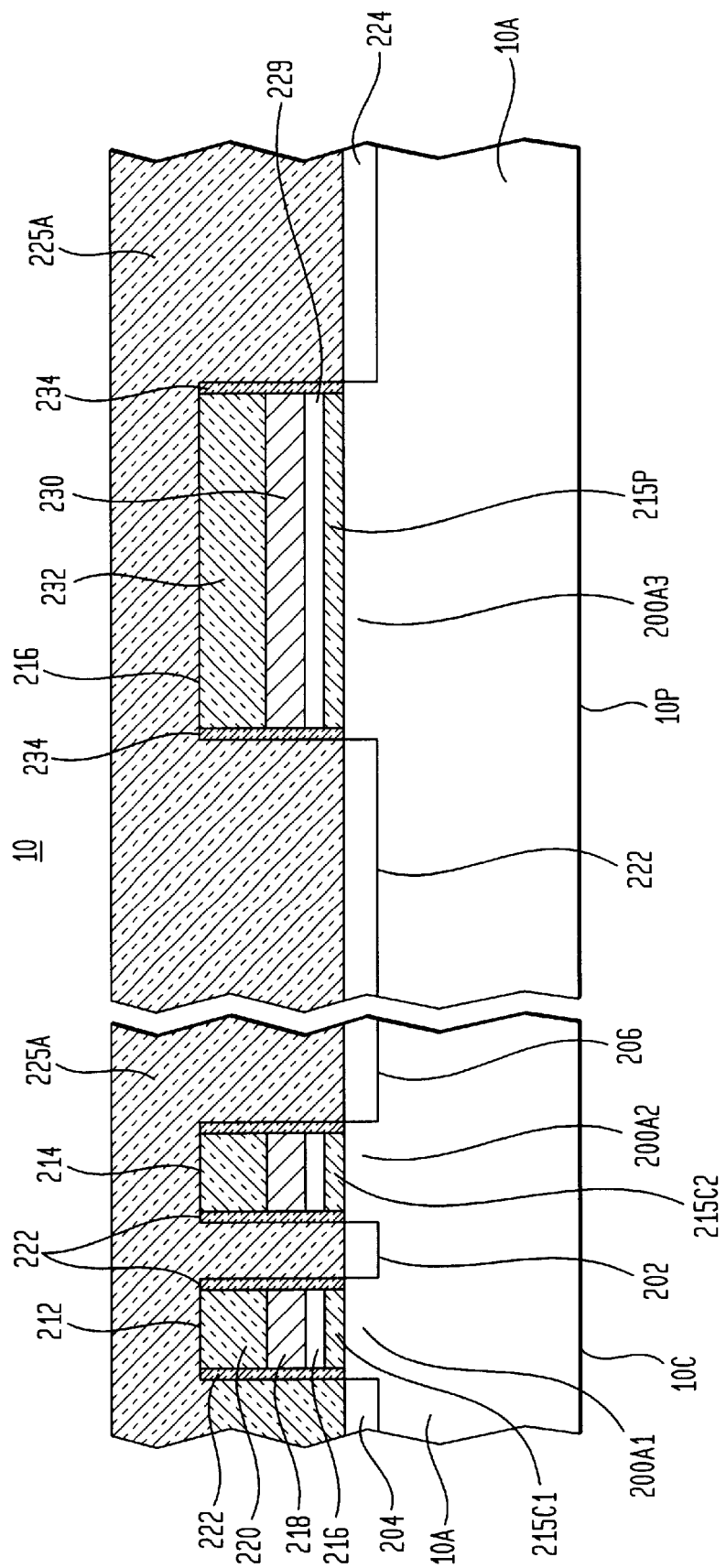
FIGS. 4 through 9 illustrate portions of a silicon chip at various stages of its processing to provide a DRAM of the kind shown in FIG. 3.

FIG. 4 shows in schematic form a silicon chip 10 having an array area 10C and a support area 10P at a stage where there have already been formed in suitable fashion gate stacks 212 and 214 of a pair of array transistors 201A and 201B in the array area 10C and a gate stack 216 of a support transistor 200A3 in the support area 10P. The transistors are essentially of the kind shown in FIGS. 1 and 2 and each includes a gate stack that overlies a channel region and includes in the transistor a doped polycrystalline gate, an overlying metal layer, and a capping layer of silicon nitride, as described with reference to FIGS. 1 and 2. Side wall spacers 222 and 234 are of underlying silicon oxide and overlying silicon nitride and are similarly included along the sidewalls of the gate stacks as described with reference to FIG. 2. Gate dielectric layers 215C1, 215C2, and 215P are on a major surface of silicon chip 10 and underlie gate stacks 212, 214, and 216, respectively. The sidewall spacers 234 are especially useful for forming the self-aligned borderless contacts to the source/drain diffused regions 222 and 224 that are to be subsequently formed on opposite sides of each gate stack 216. Also shown is a capping layer 225A of a suitable dielectric, typically BPSG, that covers the silicon chip 10 and has been planarized, typically by chemical mechanical polishing (CMP), also as described earlier.

Figure 5:
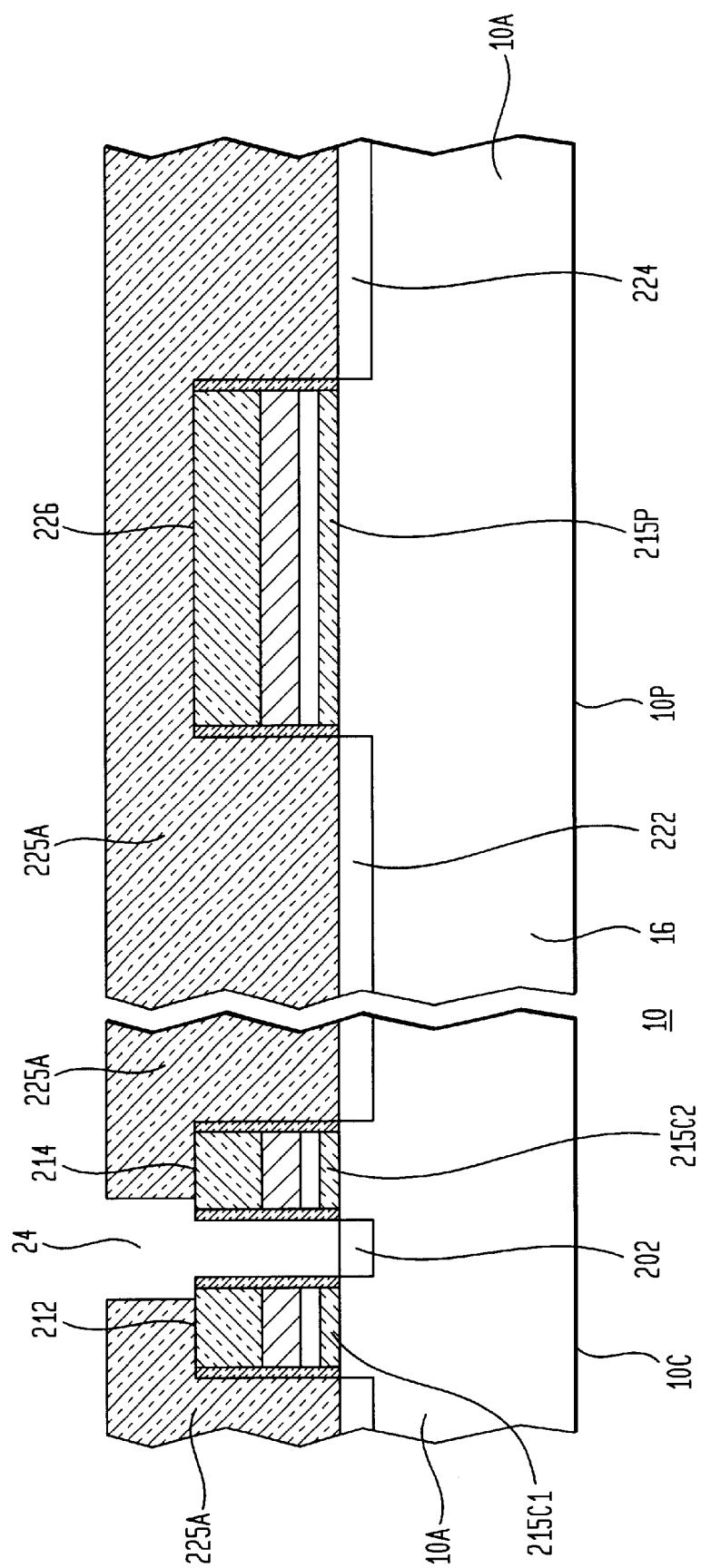

FIG. 5 shows the silicon chip 10 after there has been provided an opening 24 in the array portion of the capping layer 225A to permit inclusion of a self-aligned borderless contact (not yet shown) to the drain region 202 of the silicon chip 10 between the gate stacks 212 and 214. The opening typically is formed by reactive ion etching of an etchant that etches the BPSG selectively but does not etch the nitride covered sidewall spacers.

Figure 6:
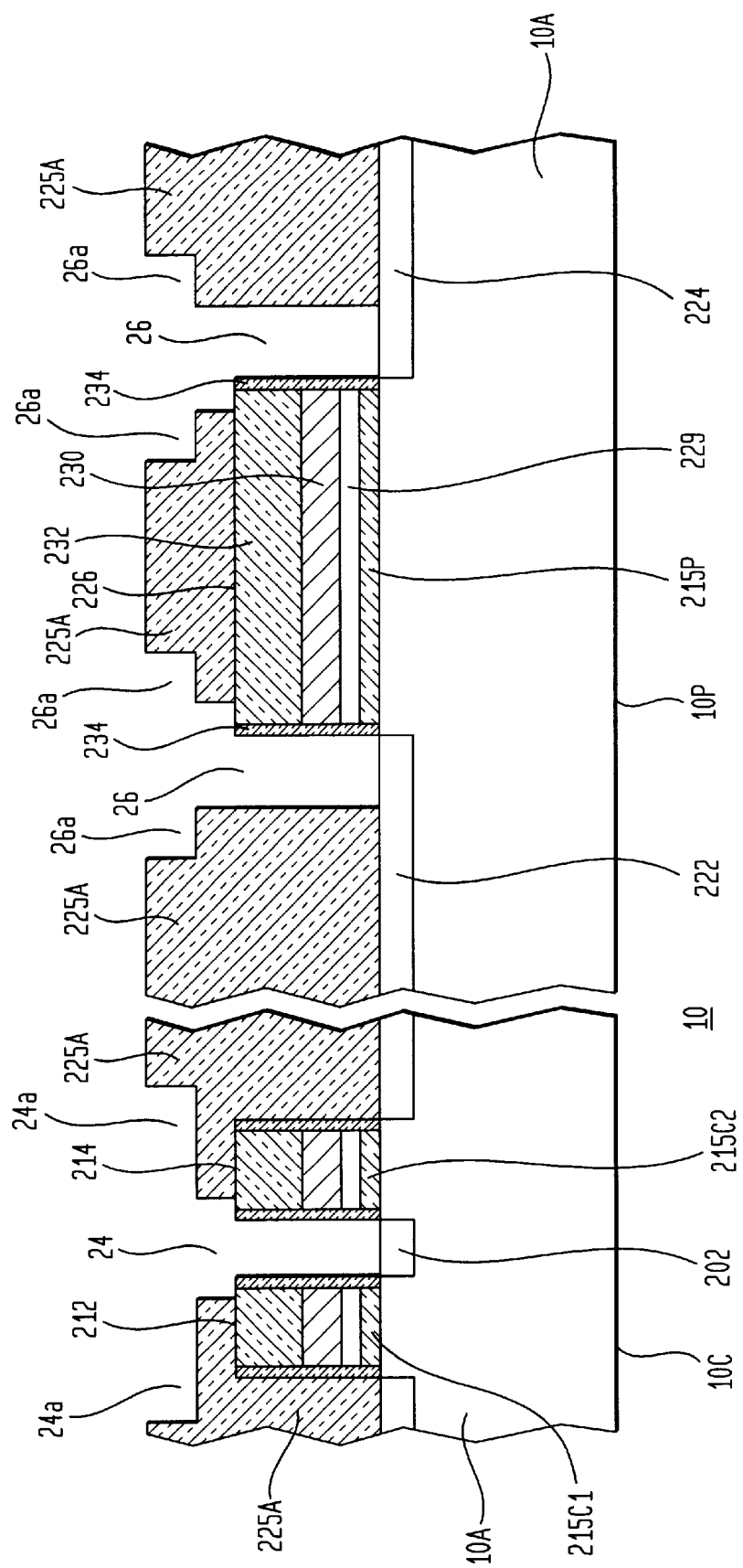

FIG. 6 shows the silicon chip 10 after there has been similarly formed opening 26 to permit contact layers and electrical conductors to the drain region 222 and source region 224 of each of the support circuitry transistors. The openings 24 and 26 have been shaped (widened at the top 24a and 26a) to adapt it for use in a dual damascene process to provide the line conductor and electrical conductor to interconnect the drain of each of the array transistors. This etching too needs to leave undisturbed the nitride covered sidewall spacers 234 of the gate stack 226 of the support transistors. There is not opened the support gate stack 226 to expose the stack metal layer 230.

FIG. 7 shows again the improved structure after the openings 24 and 26 have been filled with a conductors 207A, 236A, and 228A, respectively, that may be either doped polysilicon or a suitable metal that forms a borderless contact to the drain regions 202 of the array transistors and the drain and source regions 222 and 224, respectively, of the support transistors.

As seen the array portion of the chip in the final structure remains essentially the same as it was in the chip of FIG. 1.

Figure 7:
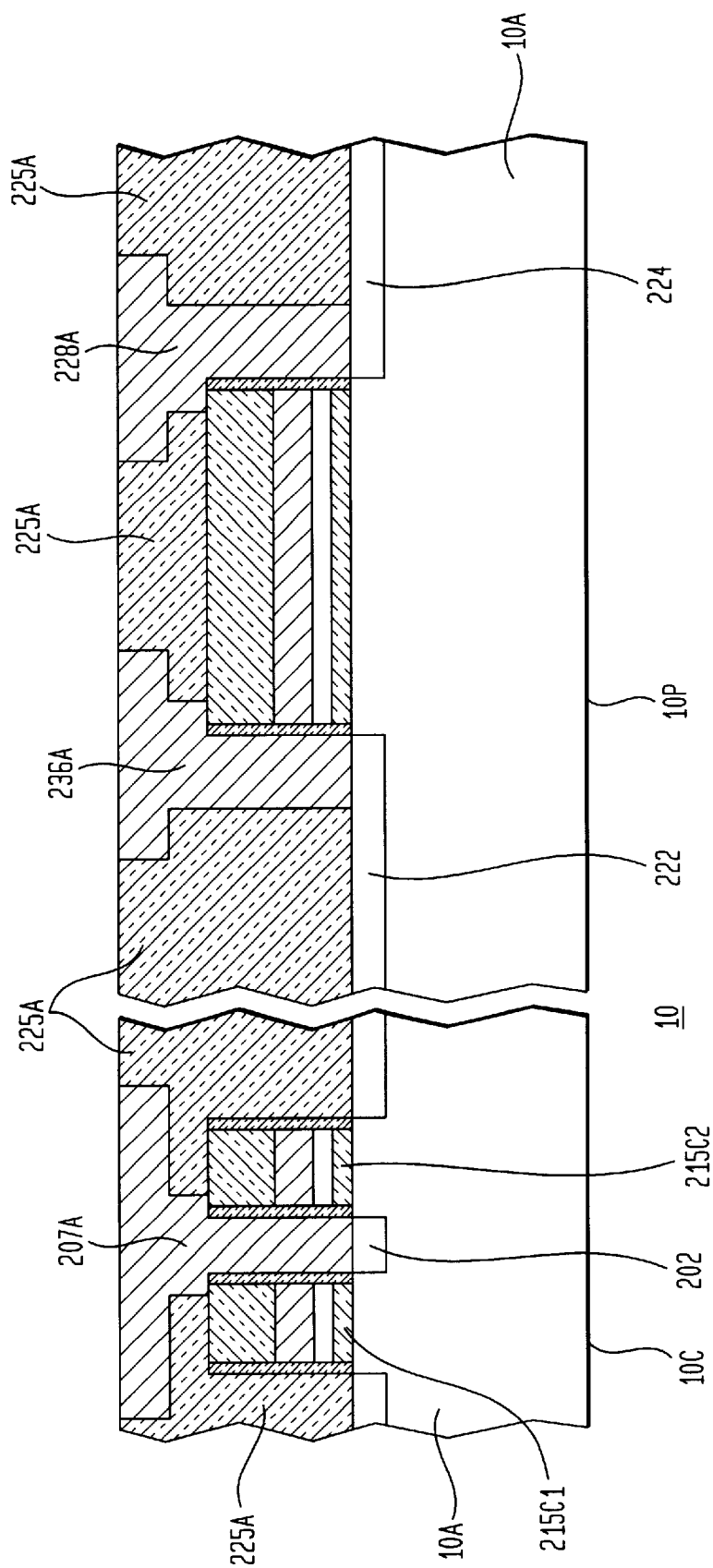
Figure 8:
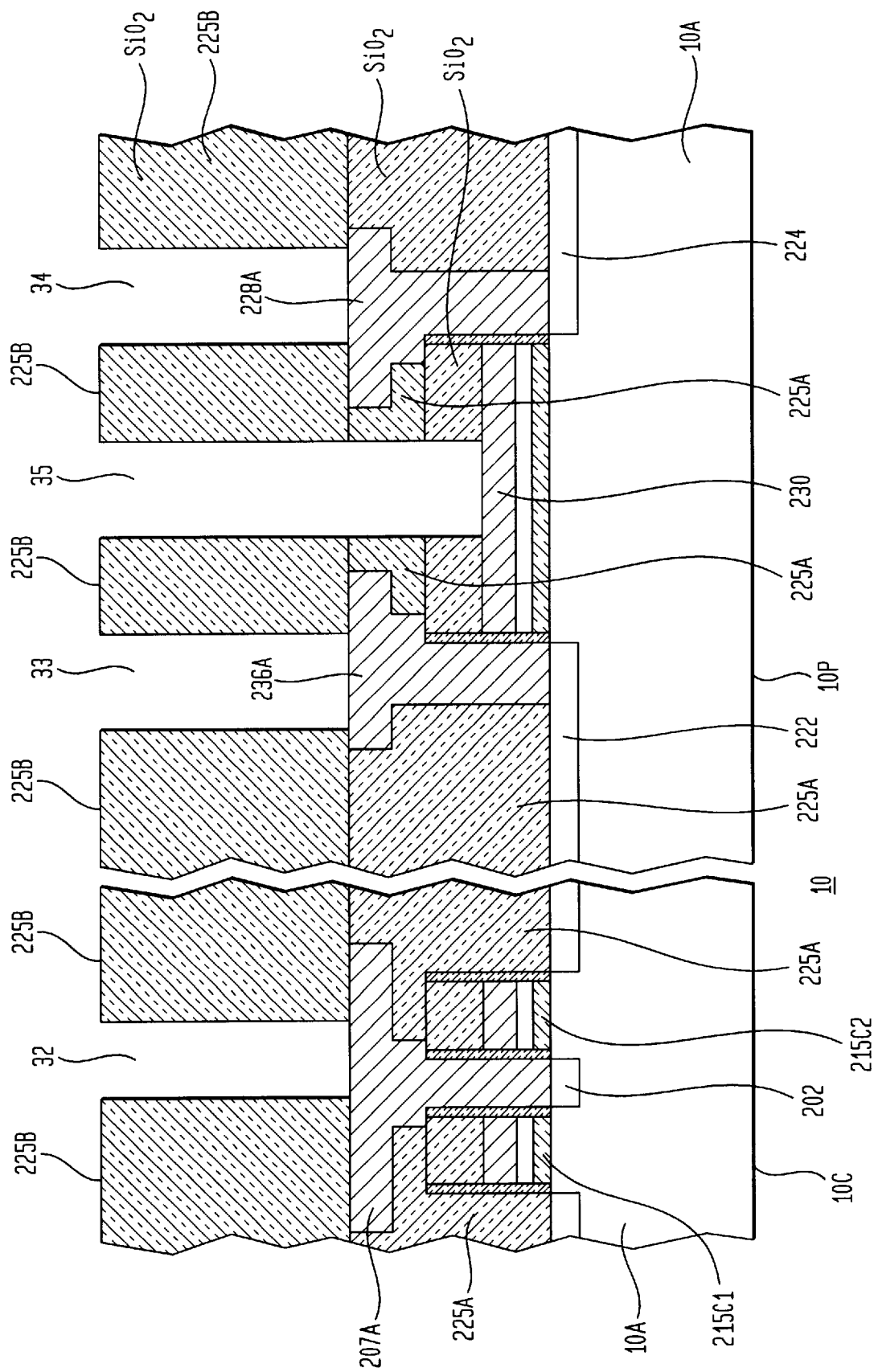

FIG. 8 shows the silicon chip 10 after there has been formed over the surface of the structure shown in FIG. 7 a planarized layer 225B of BPSG that has then been patterned to provide openings 32 for electrical conductors to the drain regions 202 of the transistors in the array, and openings 33 and 34 for electrical conductors to the drain and source regions 222 and 224, respectively, of the support transistors, and also openings 35 for electrical conductors to the metal layers 230 of the gate stack 226 of the support transistor and the array transistors. The formation of a via conductor opening 35 to the metal layer 230 of the gate stack 226 of the support transistors is done during the same etching step as the formation of the via conductor openings 32 to the drain electrical contacts 207A of the array transistor and via openings 33 and 34 to electrical contacts 236A and 228A, respectively, of the support transistors is a feature of the improved process. The patterning and etching of openings 32, 33, and 34 in the dielectric layer 225B and the etching of openings 35 through dielectric layers 225B and 225A as one sequence, saves a processing step. It eliminates the need to use a first process sequence to etch opening 24 and 26 in dielectric layer 225A and then to use a second process sequence to etch an opening through the dielectric layer 225A and the silicon nitride layer 232 of gate stack 226 of the support transistor. Two separate sets of masking, etching and depositing steps would be needed since the first set needs to etch dielectric layer 225A, which is typically silicon dioxide but to avoid etching the side wall spacers 222, which are typically silicon nitride or a combination of silicon nitrite and silicon dioxide, of gate stacks 212 and 214, and the second needs to etch through dielectric layer 225A and silicon nitride layer 226. The memory array transistor gate conductors (e.g., 218 of gate stack 212), only two of which are shown, form portions of separate word lines of the DRAM. These word lines are connected by conductors through separate openings (not shown) in dielectric layers 225A and 225B in a similar fashion to the opening through which gate conductor 227 of the support transistor passes. It is to be noted that the opening through which conductor 227 passes through dielectric layer 225A, typically at edges (not shown) of the memory array, is not widen at the top of dielectric layer 225A. This allows for a smaller geometry for the support transistor.

Figure 9:
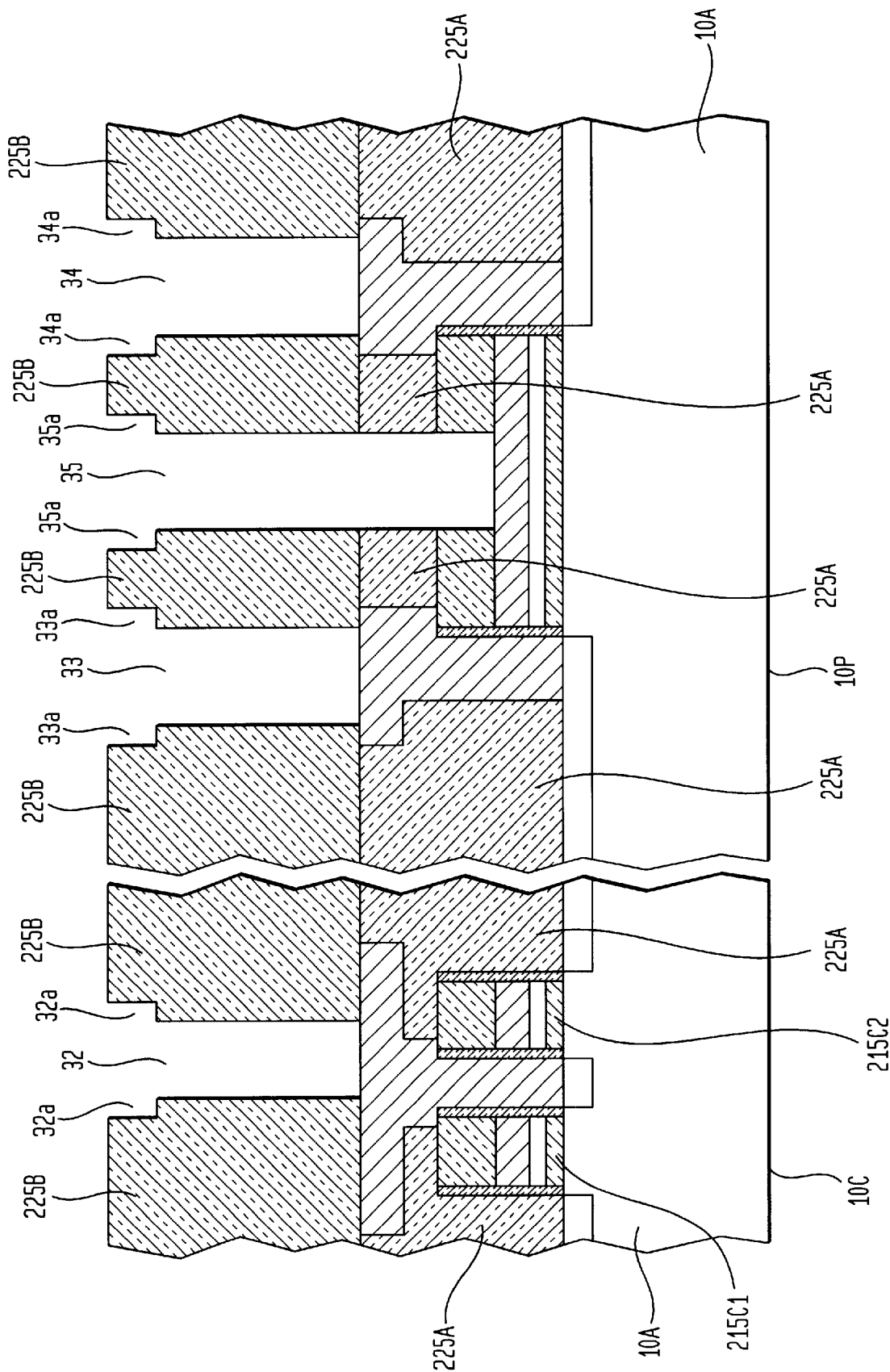

FIG. 9 shows the structure of FIG. 8 after the openings 32, 33, 34, and 35 in the BPSG layer 225B of the structure shown in FIG. 8 has been further shaped to adopt the structure to a dual damascene process for filling the via conductor openings 32 and 35 with a suitable metal.

FIG. 3 shows the final structure after the various via conductor openings have been filled with a suitable metal. Suitable metals include aluminum, platinum, tungsten or copper. In some instances, it may be desirable to line the openings with a suitable liner, as of titanium, titanium nitride, or a mixture of both.

It can be readily appreciated that the specific embodiment described is merely illustrative of the basic principles of the invention and that various other embodiments may be devised without departing from the spirit and novel principles of the invention.

What is claimed is:

1. An integrated circuit formed in and/or on a semiconductor substrate that is covered by first and second dielectric layers and that comprises a plurality of devices formed in and/or on the semiconductor substrate with at least some of the devices having contact regions which are covered by a third dielectric layer, the integrated circuit comprising:
   a first continuous electrical conductor extending through the first, second, and third dielectric layers and making electrical contact to a contact region of one device;
   a second continuous electrical conductor extending through the first dielectric layer and making electrical contact to a contact region of a device which does not have a third dielectric layer covering the contacted contact region; and
   a third continuous electrical conductor extending through the second dielectric layer and making electrical contact to the second continuous electrical conductor.

2. The integrated circuit of claim 1 wherein said first continuous electrical conductor includes a first portion adjacent to a top surface of said second dielectric layer that is wider than a second portion of said first continuous electrical conductor that contacts said contact region of said one device.

3. The integrated circuit of claim 1 wherein said second continuous electrical conductor includes a first portion adjacent to a top surface of said first dielectric layer that is wider than a second portion of said second continuous electrical conductor that contacts said contact region which does not have said third dielectric region covering the contacted contact region.

4. The integrated circuit of claim 1 wherein said third continuous electrical conductor includes a first portion adjacent to a top surface of said second dielectric layer that is wider than a second portion of said third continuous electrical conductor that contacts said second continuous electrical conductor.

5. The integrated circuit of claim 4 wherein said third continuous electrical conductor includes a third portion disposed between said first and second portions of said third continuous electrical conductor and which is wider than said second portion and narrower than said first portion.

6. An integrated circuit comprising:
   a plurality of devices having conductive contact regions formed in and/or on a semiconductor substrate;
   a first dielectric layer covering at least part of said semiconductor substrate;
   a second dielectric layer covering at least part of said first dielectric layer;
   a third dielectric layer covering at least some of said conductive contact regions, said first dielectric layer further covering at least part of said third dielectric layer;
   a first continuous electrical conductor extending through said first, second and third dielectric layers and electrically contacting at least one of said conductive contact regions;
   a second continuous electrical conductor extending through said first dielectric layer and electrically contacting at least another one of said conductive contact regions; and
   a third continuous electrical conductor extending through said second dielectric layer and electrically contacting said second continuous conductor.

7. The integrated circuit of claim 6 wherein said third dielectric layer has a different etch characteristic than said first and second dielectric layers.

8. The integrated circuit of claim 6 wherein said first and second dielectric layers are each one of the group consisting of borophosphosilicate glass (BPSG) and silicon dioxide.

9. The integrated circuit of claim 6 wherein said third dielectric layer is silicon nitride.

10. The integrated circuit of claim 6 wherein said first continuous electrical conductor includes a first portion adjacent to a top surface of said second dielectric layer that is wider than a second portion of said first continuous electrical conductor that contacts said contact region of said one device.

11. The integrated circuit of claim 6 wherein said second continuous electrical conductor includes a first portion adjacent to a top surface of said first dielectric layer that is wider than a second portion of said second continuous electrical conductor that contacts said contact region which does not have said third dielectric region covering the contacted contact region.

12. The integrated circuit of claim 6 wherein said third continuous electrical conductor includes a first portion adjacent to a top surface of said second dielectric layer that is wider than a second portion of said third continuous electrical conductor that contacts said second continuous electrical conductor.

13. The integrated circuit of claim 12 wherein said third continuous electrical conductor includes a third portion disposed between said first and second portions of said third continuous electrical conductor and which is wider than said second portion and narrower than said first portion.

14. An interconnect arrangement formed in an insulator structure of an integrated circuit; said interconnect arrangement comprising:
   a first continuous electrical conductor extending vertically through said insulator structure from a top plane of said insulator structure to a first plane within said insulator structure, said first plane being a first distance from said top plane;
   a second continuous electrical conductor extending vertically through said insulator structure from a second plane within said insulator structure to a bottom plane of said insulator structure, said second plane being a second distance from said top plane, said first distance being greater than said second distance; and
   a third continuous electrical conductor extending vertically through said insulator structure from said top plane of said insulator structure to said second plane within said insulator structure, said third continuous electrical conductor electrically contacting said second continuous conductor at said second plane.

15. The interconnect arrangement of claim 14 wherein said first continuous electrical conductor includes a first portion adjacent to said top plane of said insulator structure insulator structure that is wider than a second portion of said first continuous electrical conductor that is adjacent to said first plane within said insulator structure.

16. The interconnect arrangement of claim 14 wherein said second continuous electrical conductor includes a first portion adjacent to said second plane within said insulator structure that is wider than a second portion of said second continuous electrical conductor that is adjacent to said bottom plane of said insulator structure.

17. The interconnect arrangement of claim 14 wherein said third continuous electrical conductor includes a first portion adjacent to said top plane of said insulator structure that is wider than a second portion of said third continuous electrical conductor that is adjacent to said second plane within said insulator structure.

18. The interconnect arrangement of claim 14 wherein said insulator structure includes a first dielectric layer that extends from said second plane within said insulator structure to said bottom plane of said insulator structure, and said second continuous electrical conductor extends through said first dielectric layer.

19. The interconnect arrangement of claim 18 wherein said insulator structure includes a second dielectric layer that extends from said top plane of said insulator structure to said second plane within said insulator structure, and said third continuous electrical conductor extends through said second dielectric layer.

20. The interconnect arrangement of claim 19 wherein said second continuous electrical conductor serves as an etch stop for said second dielectric layer.

21. The interconnect arrangement of claim 14 wherein said insulator structure includes a first dielectric layer that extends from said second plane within said insulator structure to a third plane within said insulator structure, a second dielectric layer that extends from said top plane of said insulator structure to said second plane within said insulator structure, and a third dielectric layer that extends from said third plane within said insulator structure to said first plane within said insulator structure, said third plane being disposed between said second plane and said first plane; and said first continuous electrical conductor extends through said first, second and third dielectric layers.

22. The interconnect arrangement of claim 14 wherein said first continuous electrical conductor electrically contacts a contact region of at least one device.

23. The interconnect arrangement of claim 14 wherein said second continuous electrical conductor electrically contacts a contact region of at least one device.

24. The interconnect arrangement of claim 14 wherein said first and third continuous electrical conductors are formed concurrently.

* * * * *